(12) United States Patent
Pennock et al.

(10) Patent No.: US 12,184,281 B2
(45) Date of Patent: Dec. 31, 2024

(54) CONTROL OF SEMICONDUCTOR DEVICES

(71) Applicant: Cirrus Logic International Semiconductor Ltd., Edinburgh (GB)

(72) Inventors: John Laurence Pennock, Juniper Green (GB); John Paul Lesso, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 18/478,572

(22) Filed: Sep. 29, 2023

(65) Prior Publication Data

US 2024/0030923 A1 Jan. 25, 2024

Related U.S. Application Data

(63) Continuation of application No. 17/536,637, filed on Nov. 29, 2021, now Pat. No. 11,831,311, which is a
(Continued)

(51) Int. Cl.
*H03K 19/0948* (2006.01)
*H03K 17/16* (2006.01)
(Continued)

(52) U.S. Cl.
CPC ....... *H03K 19/0948* (2013.01); *H03K 17/161* (2013.01); *H03K 19/00346* (2013.01); *H03K 19/00369* (2013.01); *H03M 1/001* (2013.01)

(58) Field of Classification Search
None
See application file for complete search history.

(56) References Cited

U.S. PATENT DOCUMENTS 6,479,862 B1 * 11/2002 King ............... H01L 29/7881
257/295
2005/0248673 A1 11/2005 Fowler
(Continued)

FOREIGN PATENT DOCUMENTS

CN 101030448 A 9/2007
CN 103873792 A 6/2014
(Continued)

OTHER PUBLICATIONS

Notice of Preliminary Rejection (English Translation), Korean Intellectual Property Office, Application No. 10-2022-7005556, dated Aug. 13, 2024.
(Continued)

*Primary Examiner* — Jany Richardson
(74) *Attorney, Agent, or Firm* — Jackson Walker L.L.P.

(57) ABSTRACT

This application relates to control of semiconductor devices, in particular MOS devices, so as to reduce RTS/flicker noise. A circuit (100) includes a first MOS device (103, 104) and a bias controller (107). The circuit is operable in at least a first circuit state ($P_{RO}$) in which the first MOS device is active to contribute to a first signal (Sout) and a second circuit state ($P_{RST}$) in which the first MOS device does not contribute to the first signal. The bias controller is operable to control voltages at one or more terminals of the first MOS device to apply a pre-bias ($V_{PB1}$, $V_{PB2}$) during an instance of the second circuit state. The pre-bias is applied to set an occupancy state of charge carriers traps within the first MOS device, to limit noise during subsequent operation in the first circuit state. In embodiments, the bias controller is configured so that at least one parameter of the pre-bias is selectively variable in use based on one or more operating conditions.

20 Claims, 3 Drawing Sheets

Related U.S. Application Data continuation of application No. 16/934,304, filed on Jul. 21, 2020, now Pat. No. 11,223,360.

(60) Provisional application No. 62/877,446, filed on Jul. 23, 2019.

(51) Int. Cl.
*H03K 19/003* (2006.01)
*H03M 1/00* (2006.01)

(56) References Cited

U.S. PATENT DOCUMENTS

| | | | |
|---|---|---|---|
| 2007/0145239 A1 | 6/2007 | Mheen et al. | |
| 2008/0144391 A1* | 6/2008 | Yang | G11C 16/3404 365/185.24 |
| 2011/0267505 A1 | 11/2011 | Dierickx | |
| 2013/0020467 A1 | 1/2013 | Johnson | |
| 2013/0075593 A1 | 3/2013 | Williams, Jr. | |

FOREIGN PATENT DOCUMENTS

| | | |
|---|---|---|
| CN | 107786821 A | 3/2018 |
| KR | 1020130072804 A | 7/2013 |

OTHER PUBLICATIONS

International Search Report and Written Opinion of the International Searching Authority, International Application No. PCT/GB2020/051743, mailed Oct. 13, 2020.

Martin-Gonthier, Philippe, et al., "Novel Readout Circuit Architecture for CMOS Image Sensors Minimizing RTS Noise", IEEE Electron. Device Letter, IEEE, vol. 32, No. 6, Jun. 1, 2011, pp. 776-778.

First Office Action, China National Intellectual Property Administration, Application No. 2020800528247, issued Sep. 30, 2024.

* cited by examiner

CONTROL OF SEMICONDUCTOR DEVICES

RELATED APPLICATIONS

The present disclosure is a continuation of U.S. Non-Provisional patent application Ser. No. 17/536,637, filed Nov. 29, 2021, issued as U.S. Pat. No. 11,831,311 on Nov. 28, 2023, which is a continuation of U.S. Non-Provisional patent application Ser. No. 16/934,304, filed Jul. 21, 2020, issued as U.S. Pat. No. 11,223,360 on Jan. 11, 2022, which claims priority to U.S. Provisional Patent Application No. 62/877,446, filed Jul. 23, 2019, each of which is incorporated by reference herein in its entirety.

FIELD OF DISCLOSURE

The field of representative embodiments of this disclosure relates to methods, apparatus and/or implementations concerning or relating to control of semiconductor devices, in particular to control and/or operation of MOS devices such as transistors.

BACKGROUND

Semiconductor devices such as MOS transistors are used in a variety of applications. One known issue with such devices is random telegraph signalling (RTS) noise which arises due to traps in the semiconductor material. Crystal dislocations or similar defects, for instance at layer interfaces or due to bulk defects, can create traps in the semiconductor material of a MOS device, for instance the gate dielectric. Such traps can trap charge carriers, i.e. electrons or holes, which may then be spontaneously released. The capture or the release of a charge carrier changes the gate charge, which will affect the threshold voltage or conductivity of the underlying channel. The capture and release of charge carriers over time can thus introduce a noise component into an output of the MOS device. The term RTS noise is generally used to refer to the noise contribution from an individual trap capturing or releasing a charge carrier. The term flicker noise is sometimes used to refer to the bulk effect of the traps, e.g. as effectively the summation of the effect of all traps in a semiconductor device.

The impact of RTS noise is generally greater for MOS transistors with smaller gate areas and/or fabricated at smaller semiconductor process node geometries. The effect of a trapped charge will generally be proportionally greater for a MOS device with a smaller gate area. Also, fabrication using smaller process node dimensions may result in greater stresses than for fabrication processes with larger feature sizes, which can mean that defects are more of an issue.

Conventionally, semiconductor manufacturing processes with relatively small process node sizes have predominantly been used for implementing circuits for purely digital processing, where the nature of the digital processing may be largely immune to the RTS noise. Increasingly, however, it may be desirable to implement at least some analogue or mixed-signal circuitry using MOS transistors with such relatively small process node sizes.

SUMMARY

Embodiments of the present disclosure relate to semiconductor devices, and the operation thereof, that at least mitigate some of the issues of RTS noise and/or flicker noise.

According to an aspect of the disclosure there is provided a circuit comprising a first MOS device and a bias controller, wherein:
  the circuit is configured to be operable in a first circuit state in which the first MOS device is active to contribute to a first signal and a second circuit state in which the first MOS device does not contribute to the first signal;
  the bias controller is configured to be operable to control voltages at one or more terminals of the first MOS device to apply a pre-bias to the first MOS device during an instance of the second circuit state, wherein the pre-bias is applied to set an occupancy state of charge carriers traps within the first MOS device to limit noise from the first MOS device during subsequent operation in the first circuit state; and
  the bias controller is configured so that at least one parameter of the pre-bias is selectively variable in use based on one or more operating conditions.

In some examples the one or more operating conditions may comprise an operating condition that affects dynamics of charge carrier trapping by the charge carrier traps within the first MOS device. In some examples one of the one or more operating conditions may comprise temperature. The bias controller may be configured to receive an indication of temperature from a temperature sensor.

In some examples the one or more operating conditions may comprise an indication of monitored noise. In some examples, the indication of monitored noise may be determined from a feedback signal derived from said first signal. In some examples, the indication of monitored noise may be determined from one or more test signals derived from a test module comprising at least one test MOS device.

In some examples the one of said one or more operating conditions may comprise an operating mode for a system comprising the circuit. The system may be operable in a plurality of different modes and the different modes may have different requirements for at least one of: noise performance or signal quality; power consumption; and operating rate.

The bias controller may be configured to control a magnitude of a bias voltage applied to the first MOS device as a parameter of the pre-bias. The bias controller may be configured to control a duration of a bias voltage applied to the first MOS device as a parameter of the pre-bias. The bias controller may be configured to control a duration between consecutive applications of the pre-bias to the first MOS device as a parameter of the pre-bias. The bias controller may be configured to control a shape of a waveform for a bias voltage applied to the first MOS device as a parameter of the pre-bias.

In some examples the first signal is an analogue signal.

In some examples the circuit may be configured to operate in a sequence of states including at least one instance of the second circuit state, whether or not a pre-bias is applied during an instance of the second circuit state.

The bias controller may additionally be configured to be operable to control voltages at one or more terminals of at least one additional MOS device to apply a pre-bias to said at least one additional MOS device.

The bias controller may comprise a processor configured to receive an indication of the at least one operating condition and to determine the at least one parameter of the pre-bias to be applied. The bias controller may comprise a voltage controller for controlling at least one voltage applied to a terminal of the first MOS device based on the determined at least one parameter.

In some examples the circuit may be one of: a sensor circuit; a digital-to-analogue converter circuit, an analogue-to-digital converter circuit; and an analogue memory cell circuit.

In another aspect there is provided a circuit comprising a first MOS device and a bias controller, wherein: the bias controller is configured to be operable to control voltages at one or more terminals of the first MOS device to apply a pre-bias to the first MOS device, wherein the pre-bias is applied to set an occupancy state of charge carriers traps within the first MOS device to limit noise from the first MOS device during subsequent operation; and the bias controller is configured so that at least one parameter of the pre-bias is selectively variable in use based on one or more operating conditions.

A further aspect relates to a bias controller for controlling bias voltages applied to a first MOS device of a circuit, the bias controller being operable to apply a pre-bias to the first MOS device so as to set a defined occupation state for charge carrier traps within the first MOS device, wherein the bias controller is responsive to one or more operating conditions to dynamically adjust the pre-bias applied.

Unless expressly indicated to the contrary, any of the various features of the various implementations discussed herein may be implemented together with any one or more of the other described features in any and all suitable combinations.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

Figure 1:
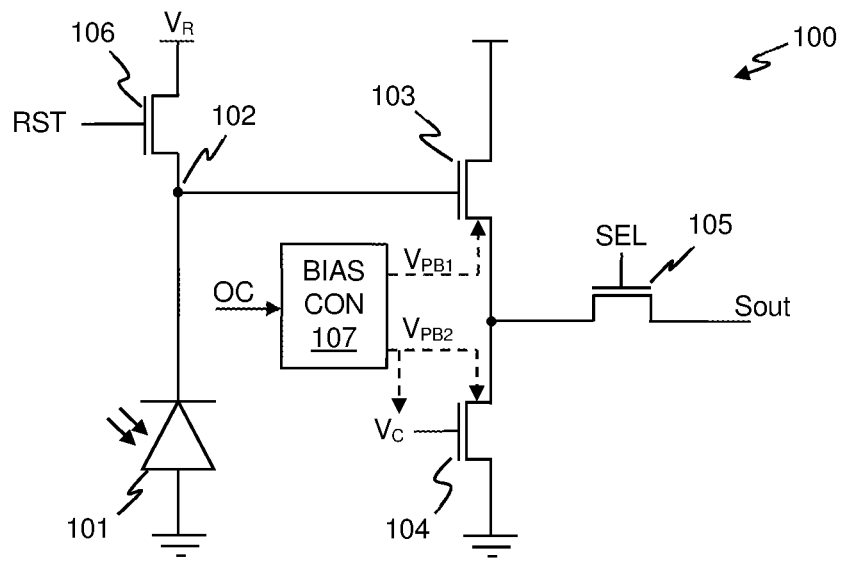
FIG. 1 illustrates one example of a pixel sensor circuit with a bias controller for applying a selectively variable pre-bias.
Figure 1:
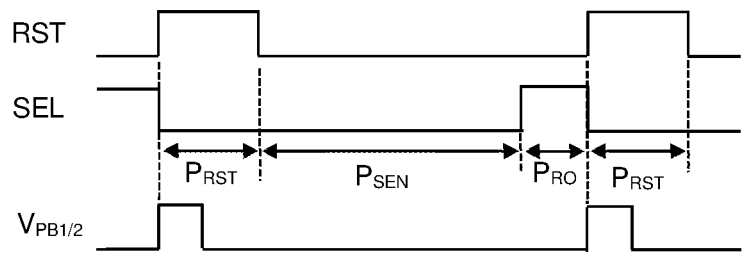

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the present disclosure relate to apparatus and methods for the control of semiconductor devices, in particular for MOS devices such as MOS transistors, that at least mitigate issues of RTS/flicker noise. Embodiments also relate to circuits including a MOS device and the control thereof. In some examples the circuitry could be circuitry that involves the generation or processing of one or more analogue signals, i.e. analogue or mixed signal circuits, although the principle may be applied to any circuitry where RTS noise is an issue, including digital processing circuitry.

As discussed above a MOS device may, in use, suffer from RTS or flicker noise. If such RTS or flicker noise occurs when the circuit is in a first state, in which the MOS device is active to contribute to a signal of interest, then any RTS or flicker noise from the MOS device can appear in the signal of interest.

In embodiments of the present disclosure, the voltage at one or more terminals of the MOS device may be controlled, prior to the circuit operating in the first state, so as to apply a bias voltage, referred to herein as a pre-bias, to the MOS device so as to set a desired population state or occupancy for charge carrier traps of the MOS device, for instance to encourage traps to be filled. The pre-bias is applied so as to reduce the amount of RTS noise during subsequent operation in the first state, when the MOS device is active to contribute to the signal of interest.

As one skilled in the art will understand, there will be a time constant associated with the occupancy of a trap, for instance, if a trap is filled, there will be a time constant associated with release of the relevant charge carrier. The time constants involved in carrier release for RTS noise are generally fractions of a second. Accordingly, if it is possible to ensure that all the traps are in a given state, say all the traps are filled, and all signal processing or read-out is then performed in a fraction of a release time constant, the probability of RTS noise affecting the output is much reduced. The occupancy state of the traps may be set, e.g. the traps may be filled, by appropriately biasing the MOSFET, for example so the surface is in accumulation or even depletion rather than a normal inversion state, yet not applying enough voltage across the dielectric to cause significant tunnelling current. Therefore, if a pre-bias is applied that sets a particular occupancy state for the traps, e.g. tends to cause substantially all traps to be filled, then the amount of RTS noise will be reduced for a period of time in subsequent operation, which in some cases could be of the order of a fraction of a second or so. Thus, prior to the circuit operating in the first state, in which the MOS device is active to contribute to the signal of interest and thus noise is an issue, a pre-bias is applied to set an occupancy or population state of the traps so as to reduce RTS or flicker noise when operating in the first state.

The pre-bias will generally be applied at a time when the MOS device is not active to contribute to the signal of interest. Thus the pre-bias may be applied during at least part of a time in which the circuit is in a second circuit state in which the MOS device is not being used to contribute to the signal of interest, and during which suitable a bias voltage can be applied to one or more terminals of the MOS device.

There are many circuits in which, during normal operation, the circuit may be controlled to operate in different states in a periodic or cyclic manner, e.g. based on a defined sample rate, and the states may include a first state in which the MOS device may be active to contribute to a signal of interest and a second state in which the MOS device does contribute to a signal of interest. For such circuits the pre-bias could be applied for at least part of the time that the circuit is in the second state.

For instance, some sensor circuits or analogue-to-digital converters (ADCs) may involve a sensing phase in which charge/voltage is developed at a sampling node in response to a relevant input, and a subsequent processing or read-out phase where the charge/voltage at the sampling node is sampled or processed. In some examples there may additionally be a reset phase to reset the sampling node prior to the next sensing phase. The processing circuitry may comprise a MOS device that is active in the processing or read-out phase, which generates the output signal of interest, and a pre-bias may be applied before the processing phase, e.g. in the sensing or reset phase depending on the type of circuit. Similarly, some digital-to-analogue converters (DACs), which use MOS devices to generate an analogue output based on a digital input may also involve a short return-to-zero phase between successive sample periods to reduce transients, and a pre-bias could be applied in the return-to-zero phase.

FIG. 1 illustrates one example of a circuit that comprises a MOS device and which operates in a sequences of circuit states or phases to generate an analogue output signal. The circuit in the example of FIG. 1 is a pixel sensor circuit 100 for a photo-detector. FIG. 1 illustrates an active pixel sensor circuit including a pinned-photo diode and four transistors which, as will be understood by one skilled in the art, is a known type of pixel circuit for photo sensor arrays. FIG. 1 also illustrates some example waveforms to illustrate the timing of various phases of operation.

FIG. 1 illustrates a photo-diode 101 which is configured as a pinned photo-diode and which is coupled to a sampling node 102. The sampling node is coupled to the gate of MOS transistor 103 which, together with MOS transistor 104, provides a source-follower buffer. The gate of transistor 104 is, at least during read-out, driven with a suitable control voltage $V_C$ to provide the desired source-follower behaviour. Pixel select transistor 105 allows the pixel to be selectively connected to row/column bus circuitry (not illustrated) to provide an output signal Sout for read-out. Reset transistor 106 is provided to enable reset of the photodiode/pixel.

As will be understood by one skilled in the art such a pixel sensor circuit 100 is operable in a sequence of states or phases. During a reset phase $P_{RST}$, the reset transistor is enabled so that the voltage at the sampling node 102 is set to be equal to the reset voltage $V_R$ (less the threshold voltage of the reset transistor 106 for a soft reset). The reset transistor 106 is then turned off, and the circuit enters a sensing phase $P_{SEN}$, during which light incident on the pinned photo diode results in a variation in charge and, due to the self integration of the pinned-photo diode 101, the voltage at the sampling node. At the end of the sensing phase the select transistor 105 may be enabled to provide read-out of the pixel. As the sampling node is coupled to the gate of transistor 103 of the source follower, the voltage at this node determines the output of the source follower, which is provided, via the select transistor 105 as the output signal Sout.

It will be understood by one skilled in the art that the circuit and operation described with reference to FIG. 1 is just one example, and there are alternative circuits and/or methods of operation that could be implemented.

The circuit 100 also includes a bias controller 107 for applying a selectively variable pre-bias to at least one of the MOS devices so as to mitigate against RTS noise during the read-out phase. The pre-bias is thus applied to at least one of the MOS devices which contributes to the output signal Sout in the read-out phase. FIG. 1 illustrates that the bias controller 107 may apply a pre-bias to one or both of the transistors 103 and 104 of the source-follower, as it is these transistors that generate the output signal Sout in the read-out phase $P_{RO}$. In some embodiments a pre-bias could additionally or alternatively be applied to the select transistor 105. As noted above, RTS noise may have a proportionally greater effect on transistors with a smaller gate area, and thus the pre-biasing may advantageously be applied to smaller MOS devices of the circuit that contribute to the output signal, which in this example may be the transistors 103 and/or 104.

As discussed above, the pre-bias is applied to encourage a desired occupancy of traps within the MOS device, e.g. to encourage all traps to be filled or traps to be emptied. The pre-bias condition may be defined so as to set the population of traps in the MOS device structure by emptying traps or filling traps or to set some other similar impermanent atomic-level structural changes in the MOS structure in order to reduce the likelihood of traps in the MOS structure randomly filling or emptying during subsequent operation in the read-out phase. Thus the pre-bias may be applied so that, at the end of the pre-biasing, it is expected that substantially all traps are in the intended occupancy state, e.g. filled or empty.

The pre-bias may be applied so as to bias the MOS device to take the MOS device out of the inversion state (which may be the normal operating state) into an accumulation or depletion state. The pre-bias may generally be applied so as to avoid generating any significant tunnelling current.

The pre-bias may be applied by applying suitably controlled bias voltages to one or more of the terminals of the MOS device. Thus a controlled voltage may be applied to one or more of the gate terminal, bulk terminal, source terminal or drain terminal respectively.

Thus, in addition to the bias conditions for the MOS device that would be applied in the normal operation, the circuit is configurable to operate with the MOS device in another bias condition. This additional bias condition is used to pre-bias the MOS structure before a processing or read-out operation, so as to reduce time-dependent corruption of the relevant output by flicker or telegraph noise during the processing or read-out operation. The pre-bias condition may be defined so as to set the population of traps in the MOS structure by emptying traps or filling traps or other similar impermanent atomic-level structural changes in the MOS structure in order to reduce the likelihood of traps in the MOS structure randomly filling or emptying during subsequent use.

The pre-bias condition may correspond to an accumulation mode or alternatively a depletion mode of the MOS device. For an NMOS accumulation generally corresponds to a negative gate voltage. Also, advantageously the substrate may be slightly forward biased with respect to source or drain, or at least not reverse biased. Thus, the pre-bias condition may involve imposing a gate voltage or a bulk voltage different from that for read operation.

TABLE 1

|  | G | S | B |
|---|---|---|---|
| PRE-BIAS | −VN | +VP | +VP |

Table 1 illustrates one example of voltages applied to terminals of a NMOS device to drive it into accumulation.

In this example, in the pre-bias state, the control gate terminal G is taken negative enough to place the NMOS into accumulation, or at least out of inversion into depletion, but not negative enough to result in significant tunnelling current. Preferably the substrate is taken to the same voltage as the source or drain, or maybe slightly more positive, rather than the default ground potential to also encourage the transistor to go into accumulation. Electrons may thus tunnel into the gate oxide or other gate dielectric to fill oxide traps.

In the example of FIG. 1, during the reset phase the sampling node, and hence the gate terminal of transistor 103, is typically connected to the defined reset voltage $V_R$ via the reset transistor 106. A suitable pre-bias could thus be applied to one or more of the source or bulk terminals of transistor 103, represented generally in FIG. 1 by $V_{PB1}$ to achieve the desired biasing across the MOS device with respect to the defined reset voltage $V_R$ or the reset voltage could itself be controlled for an initial part of the rest phase to a voltage suitable for applying the desired pre-bias, before then reverting to the defined reset level for the rest of the reset phase $P_{RST}$ to reset the pixel. For transistor 104 controlled voltages could likewise be applied to, e.g. the source or bulk terminals, but additionally or alternatively the gate voltage $V_C$ could also be controlled appropriately, represented generally in FIG. 1 by $V_{PB2}$. Note the illustrative waveforms for the $V_{PB1}$ and $V_{PB2}$ signal are purely for illustrating the principles of the relevant timing, and do not imply anything about magnitude or polarity of the pre-bias voltages applied and will be understood that the voltages applied to transistor 103 and 104 may be different from one another.

FIG. 1 illustrates that the pre-bias may be applied during at least part of the reset phase $P_{RST}$. During this phase the pixel circuit is not outputting an output signal and the transistors 103 and 104 of the source follower would otherwise be inactive. Applying the pre-bias during this period thus does not interfere with operation of the pixel circuit. The duration of the sensing phase $P_{SEN}$ and the subsequent read-out phase $P_{RO}$ are generally relatively short and can be shorter than a time constant associated with the traps for capture or release or charge carriers. Thus, setting the population level of the traps of the MOS device during the reset phase $P_{RST}$ can reduce the noise during the read-out phase $P_{RO}$.

For the example of FIG. 1, a suitable pre-bias could additionally or alternatively be applied to one or more MOS devices during at least part of the sensing phase. In this example there is no output signal during the sensing (or charge integration) phase and thus a pre-bias could be applied to one or more MOS devices, e.g. MOS device 104.

It will, of course, be understood that for a conventional pixel circuit having the same basic structure as the pixel circuit 100 illustrated in the FIG. 1, the voltages at the various terminals of the transistors 103 and 104 may be held at certain defined voltages in the reset phase. However, for the conventional pixel circuit, the relevant voltages at the terminals of the transistors 103 and 104 during the reset phase $P_{RST}$ would not be defined so as to set a particular occupancy of traps of the relevant MOS device(s), for example to encourage all traps to be filled. Where the pre-bias is thus applied as just part of some other phase of operation of the circuit, e.g. as just part of the reset phase as discussed with reference to FIG. 1, then the pre-bias voltage that is applied is a variation from the voltage that is otherwise be used for the rest of the relevant phase in which the pre-bias is applied.

In embodiments of the present disclosure the pre-bias which is applied is selectively controlled, in use, based on an at least one operating condition or system parameter. Thus, the bias controller 107 is configured to selectively vary the pre-bias applied based on one or more operating conditions of the circuit. That is, at least one characteristic or parameter of the pre-bias applied may be dynamically adjusted in use according to at least one operating condition of the circuit.

Whilst applying a pre-bias can be advantageous for noise reasons, applying a pre-bias voltage to the MOS device may be disadvantageous in other respects.

For instance, applying a relatively high pre-bias voltage to the MOS device may be detrimental to the longevity and/or reliability of the MOS device. Applying a relatively high bias voltage may result in premature aging or degradation of the semiconductor material of the MOS device.

In at least some implementations applying the pre-bias may increase the power consumption of the circuit compared to operation without applying the pre-bias, and the power consumption may be greater for higher magnitudes and/or durations of pre-biasing. Power consumption and power efficiency may generally be important considerations for a number of applications, especially for battery powered devices.

In some implementations, the time taken to apply a suitable pre-bias could result in some additional latency in operation of the relevant circuit. For instance, whilst FIG. 1 illustrates that the pre-bias is applied during just part of the reset phase $P_{RST}$, if applying a suitable pre-bias required a longer duration for the reset phase than otherwise would be the case, then this could reduce the effective maximum sampling rate. In some other circuit implementations, applying a suitable pre-bias may require introduction of a dedicated pre-biasing phase into a sequence of circuit operations, with a consequent impact on latency.

Various factors influence trap dynamics, for instance temperature. Therefore the magnitude or duration of the pre-bias which is required to achieve a desired population state for the traps may vary in use. Likewise the time constants for release may vary and thus the interval between successive applications of the pre-bias to achieve a certain noise performance may vary in use. The amount of RTS noise itself may vary with some operating conditions, and thus the amount of biasing needed to achieve a desired noise performance may vary. Also, depending on an operating mode of the device, different levels of noise performance may be acceptable.

Therefore, the pre-bias which is required for one set of operating conditions may be greater than that is required for a different set of operating conditions.

In embodiments of the present disclosure, the bias controller is thus configured to selectively vary the pre-biasing applied based on at least operating condition of the circuit. One or more parameters of pre-bias applied may be dynamically varied by the bias controller based on the relevant operating condition(s), so as to apply a pre-bias which is appropriate for the relevant operating condition(s).

As illustrated in FIG. 1 the bias controller may thus receive a signal OC indicative of at least one operating condition of the circuit and may adjust the parameters of the pre-bias accordingly.

The bias controller 107 may be responsive to one or more of a variety of different operating conditions, which may be functional or environmental, and may be operable to adjust one or more of a range of parameters of the pre-bias.

Figure 2:
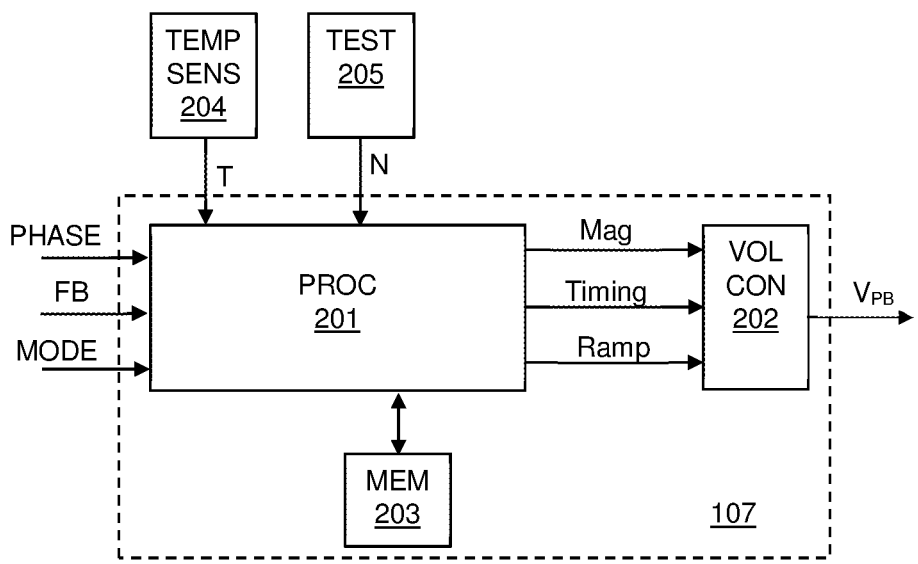
FIG. 2 illustrates an example of a bias controller.

FIG. 2 illustrates generically one example of a bias controller 107 to illustrate just some examples of how the bias controller 107 may respond to various operating conditions to control one or more parameters or characteristics of the pre-bias.

The at least one operating condition could comprise at least one parameter, such as temperature, that effect trap dynamics (i.e. influences the capture and release of charge carriers from the traps) and hence has an impact on at least one of: the pre-bias required to achieve a certain occupancy state for the traps; the time constants for release; and/or the expected level of RTS noise. Additionally or alternatively the at least one operating condition could comprise at least one parameter indicative of a monitored noise performance or SNR. Additionally or alternatively the at least one operating condition could comprise an operating mode of the host system or device, for example which sets a desired noise or accuracy performance, a power consumption level or an operating rate.

FIG. 2 illustrates that the bias controller 107, in this example, comprises a processor 201 and a voltage controller 202, and optionally a memory 203. The processor 201 receives the indications of the one or more operating conditions and determines suitable parameters for any pre-bias to be applied, possibly by retrieving stored parameters from memory 203, which may, for example, be a look-up table or similar, and/or by implementing a system model or applying an algorithm that may be stored in memory 203. In some applications the processor may be configured to execute program code stored in the memory 203 and the bias controller may be programmable in use.

If a pre-bias is to be applied, the processor 201 may control the voltage controller 202 to supply an appropriate pre-bias voltage $V_{PB}$ at an appropriate time. FIG. 2 illustrates a single output for clarity but, as discussed above, if applying the pre-bias involves different voltages being applied to different terminals of one or more MOS devices, the voltage controller 202 may be operable to supply the different voltages to the relevant device terminals.

In some examples a relevant operating condition may be temperature and thus the bias controller 107 may receive at least one indication of temperature T, as an indication of an operating condition. The received indication T may be an indication of temperature from at least one temperature sensor 204, which may be integrated with the circuit 100 to provide an indication of temperature of at least part of the circuit or chip, or an off-chip temperature sensor of a host device.

Trap dynamics vary with temperature, e.g. the time constants associated with capture and release of charge carriers. Thus the magnitude and/or duration of a pre-bias voltage applied to achieve a desired occupancy state may vary with temperature. The processor 201 may thus receive the indication of temperature and set an appropriate magnitude and/or duration for the pre-bias voltage to be applied during an instance of pre-bias. Thus, referring back to FIG. 1, the duration of the pre-bias applied during an instance of the reset phase and/or the magnitude of the bias voltage applied across the MOS device may be varied appropriately, for instance within a prescribed range, for the relevant temperature.

In some instances other aspects of how the bias voltage applied may also have an impact. In some instances, the trap dynamics may be sensitive to the ramp rate of a voltage applied during a pre-biasing operation. Therefore the ramp rate of the pre-bias applied, or other appropriate characteristics of a waveform of the biasing voltage, may be controllably adapted in operation.

As noted, temperature will impact the time constant associated with capture and release of charge carriers from traps within a MOS device. Therefore the duration, following application of an appropriate pre-bias, for which there is a significant reduction in RTS noise may vary with temperature. The time between successive applications of the pre-bias may thus additionally or alternatively be controlled. For example, referring back to FIG. 1, in some implementations the time constant associated with trap release and capture may, in at least some operating conditions, be of the order of the duration of several cycles of operation of the pixel circuit. That is, if a suitable pre-bias is applied in one reset phase, the benefit of reduced RTS noise may persist for a period that includes the next read-out phase and one or more subsequent read-out phases. To achieve a desired noise performance it may therefore not be necessary to apply a pre-bias during every instance of a reset phase and instead a pre-bias could be applied only in some instances of a reset phase, with the interval between successive applications of the pre-bias being selectively controlled by the processor 201.

The processor 201 may therefore control the voltage controller 202 to selectively control one or more of the magnitude, timing (i.e. duration and/or interval), or waveform characteristics such as ramp rate of a pre-bias $V_{PB}$ to be applied. The voltage controller 202 may comprise any suitable controller for providing the relevant voltage control. For instance, in some implementations only the timing of the pre-bias may be selectively controlled, i.e. the magnitude of the pre-bias voltages applied may be fixed, in which case the voltage controller could simply be implemented by a switch for selectively connecting to a defined voltage at appropriate times. If control over the voltage magnitude and/or ramp rate is required the voltage controller may comprise a suitable variable-output voltage generator or regulator or voltage DAC or the like. It will also be understood that various aspects of the voltage controller may be implemented by different components, i.e. a variable power supply may be controllable to vary the magnitude of a pre-bias voltage and some other switching control is used to control the timing.

To ensure that the pre-bias is applied at an appropriate time in the operation of the circuit 100, the processor may receive some clocking or timing signal, e.g. a signal PHASE indicating the various phases of operation of the circuit.

Temperature is one environmental factor that affects trap dynamics but any other operating conditions that impact trap dynamics may likewise be taken into account in a similar way and used to control the parameters of the pre-bias applied.

Additionally or alternatively, in some embodiments the processor 201 may controllably vary the parameters of the pre-bias applied based on an indication of a level of RTS or flicker noise or of SNR (signal-to-noise ratio).

In some implementations a signal which is derived from the output signal Sout from the circuit 100 could be analysed to determine the extent of any RTS noise. Thus the bias controller 107 could be arranged to selectively control the pre-bias applied based, at least partly, on feedback from the output signal. The processor 201 may thus receive a feedback signal FB which is derived from the output signal Sout as an indication of an operating condition.

In some instances the feedback signal FB may be a version of the output signal Sout, for instance a version of Sout converted to digital. For the pixel circuit illustrated in FIG. 1, the analogue output signal Sout from the pixel may typically be converted to a digital signal at some point downstream, and thus the digital version of Sout could be tapped and supplied to the processor 201 as the feedback signal FB. In this case the processor 201 may be configured to process the feedback signal to determine at least one noise measure. There are various ways in which a signal can be processed to determine an indication of noise, e.g. to provide an estimate of the amount of RTS noise or a general indication of SNR, and the processor may employ any one or more of such analysis techniques.

In some arrangements the feedback signal FB could just be an indication of the noise measure which is determined by some other module. For instance, for the example of an active pixel sensor of FIG. 1, the pixel circuit 100 illustrated would typically just be one of very many pixels. In some instances it may not be practical to separately analyse the noise in the signal from each individual pixel and/or a better indication of noise might be possible by analysing the outputs signals from multiple pixels together. In such a case, the pre-bias parameters for a group of pixels may be controlled based on an indication of noise determined from the output signals from one or more of the pixels of that group, and thus the feedback signal FB may be the determined indication of noise.

In some implementations a determination of noise may additionally or alternatively be derived from some test module 205, which may be integrated with, i.e. formed on the same chip as, the circuit 100. The test module may be implemented with test MOS devices which are the same or similar to those to which the pre-bias is applied, and in some instances could comprise at least one dummy circuit, in this case a dummy pixel circuit which is similar to an actual pixel circuit 100, but wherein the input to the source follower is controlled to one or more predefined reference levels. The output signal(s) from the test module can be analysed, based on the known inputs, to determine an indication of RTS noise. In some examples a constant level input may be applied to a MOS device during a test phase and the output monitored to detect any step changes in level indicative of RTS noise.

In some instances the various signals generated by the test module may be analysed by the processor 201 of the pre-bias controller 107 and thus the input N from the test module may comprise the various test signals generated which are used as the indication of operating condition. In some instances however the analysis may be performed as part of the test module 205 and the indication N supplied to a bias controller 107 may be determined by noise levels or the like. In some instances, a pre-bias may be applied to one or more MOS devices of the test module and one pre-bias applied may match that applied to the MOS devices of the actual circuit 100 and/or different pre-biases may be applied at different times and/or to different MOS devices.

The processor 201 may thus receive an indication of monitored noise or SNR as an indication of an operating condition, which may comprise a feedback signal FB and/or an indication of noise N from a test module. Based on the indication of present noise levels the processor may selectively control any one or more of the parameters of the pre-biasing applied as discussed above, e.g. the magnitude of a pre-bias voltage applied, the duration of the pre-bias applied, the interval between successive applications of pre-bias and/or the form of the pre-bias waveform, e.g. ramp-rate. In this case the parameters may be controlled varied to maintain the noise measure at a minimum or below a defined threshold, or maintain a certain minimum SNR.

For some implementations it may be possible that a desired noise performance can be achieved, in certain conditions, without any pre-bias being applied, in which case the processor 201 may control the voltage controller so that no pre-bias is applied unless the monitored noise performance ceases to be within an acceptable limit, e.g. because the noise performance worsens or a higher noise performance is required. A parameter of the pre-biasing which is selectively controlled by the bias controller 107 may thus be whether any pre-bias is applied at all. This may be seen as a timing parameter in that the processor 201 controls the voltage generator 202 so that a pre-bias is applied only at certain times in operation, when it is determined that some pre-bias is required.

In some implementations the operating conditions may comprise an indication MODE of an operating mode, e.g. an operating mode for the circuit or host device. The operating mode may in some cases determine an operating requirement, for instance in terms of quality performance or power consumption, and the processor may therefore control any pre-bias applied accordingly.

For instance, for the example of FIG. 1 where pre-bias may be applied to MOS devices of pixel circuits of an image sensing array, the operating modes may comprise different accuracy or noise performance modes.

A first mode may correspond to a relatively high performance mode and a second mode may correspond to a lower performance mode, such that a greater amount of RTS noise may be acceptable in the second mode compared to the first mode. The processor 201 may receive an indication as to whether the device is operating in the first mode or the second mode and control the pre-bias accordingly. In some examples the bias controller may be operable to apply a pre-bias when the device is operating in the first mode and but to apply no pre-bias when the device is operating in the second mode. Alternatively the controller may be operable to apply a pre-bias in the second mode, but the interval between successive applications of the pre-bias may be greater in the second mode than the first mode and/or at least one of an allowed voltage magnitude and a duration for the pre-bias may be lower in the second mode than the first mode. In some examples different thresholds for acceptable monitored noise levels may be set in the first and second modes.

Additionally or alternatively one mode could correspond to a low power mode, where no pre-bias is applied so as to conserve power, or the maximum magnitude, duration or interval of the pre-bias applied to limited, and another mode may correspond to a higher power mode, where a pre-bias is applied that may have a greater magnitude, duration or repeat frequency than in the low power mode.

In some examples the indication of operating condition or mode could be an indication of a required operating rate for the system, for instance a required sampling rate. In some modes of operation a faster sampling rate may be required which may limit the duration for which a pre-bias may be applied and/or how frequently a pre-bias may be applied. The processor therefore may be configured to set the duration and/or repeat interval of the pre-bias to allow the required operating speed. In some instance the voltage magnitude or ramp rate may also be varied with the duration so that any pre-bias applied sets the desired trap occupancy.

In general therefore the bias controller 107 receives one or more indications of operating conditions, such as one or more of: indication of environmental conditions such as temperature T; an indication of noise or signal quality such as feedback signal FB indicative of noise or SNR of the output signal or an indication of noise N from a test module; or an indication of a system operating mode such as quality, power consumption or required operating rate, and selectively controls the parameters or characteristics of a pre-bias that may be applied to one or more MOS devices. The parameters of the pre-bias which is applied may include one or more of: a magnitude of the pre-bias voltage(s), the timing of the pre-bias voltage(s), i.e. the duration and/or interval between application, i.e. the duty cycle of the pre-bias; and the waveform characteristics. The bias controller may, for some operating conditions, not apply any pre-bias.

The bias controller of FIG. 2 has been described with respect to controlling a pre-bias applied to MOS devices of a pixel sensor circuit as described with reference to FIG. 1. It will be understood however that the pixel sensor circuit 100 may comprise just one pixel of a larger pixel array and each pixel may have a bias controller 107 such as described with reference to FIG. 2, or one bias controller 107 may be configured to selectively control the respective pre-bias applied to a group of more than one pixel circuit.

A bias controller for dynamically varying a pre-bias applied to MOS devices to reduce RTS noise may also be advantageously implemented in a variety of other applications.

Figure 3:
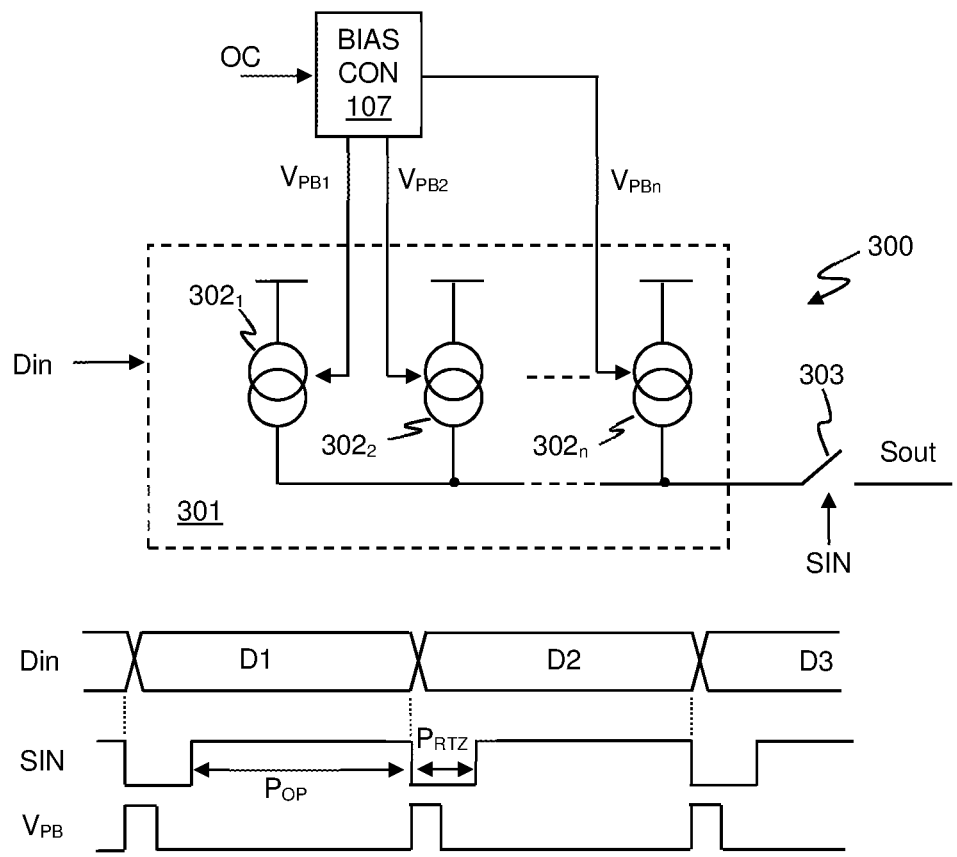
FIG. 3 illustrates an example of a current DAC with a bias controller.

For example, FIG. 3 illustrates a circuit 300, which in this example is a current DAC (digital-to-analogue converter) circuit 300. The circuit includes a current DAC 301 which comprises a plurality of current sources $302_1$ to $302_n$, which can be selectively enabled or disabled to generate a defined current. The currents from the current sources $302_1$ to $302_n$ may be weighted with respect to one another.

The current DAC 301 receives a digital input signal at a given sample rate and, based on the input data sample, e.g. D1, D2 etc., selects a set of one or more of the current sources $302_1$ to $302_n$. During an output phase $P_{OP}$ the selected current sources are thus active to contribute to the output signal Sout and an output switch 303 is closed.

At the end of each sample period, if the digital sample value changes, various of the current sources $302_1$ to $302_n$ may be activated or deactivated. Following such a change the current at the output may take some time to settle due to time constants associated with the various current sources turning on or off. This can lead to current transients or spikes in the output signal and a form of distortion referred to as inter-symbol interference. To avoid this problem the DAC may implement a return-to-zero approach, where at the end of each sample period, when the digital code value changes and the relevant current source are activated and deactivated, the output switch 303 is opened during a return-to-zero phase $P_{RTZ}$. This prevents any transients due to a change in the digital code value from being output, which can reduce distortion in the output signal Sout.

As will be understood the current sources $302_1$ to $302_n$ may be implemented using MOS devices, for instance configured as current mirrors with different weightings. In embodiments of the present disclosure a pre-bias may be advantageously applied to the MOS devices of the current sources, where the pre-bias may be selectively controlled in use based on one or more operating conditions for the DAC circuit. FIG. 3 thus illustrates that DAC circuit 300 may thus comprise a bias controller 107, which receives an indication of one or more operating conditions OC and which dynamically varies one or more parameters of the pre-bias applied.

Figure 4:
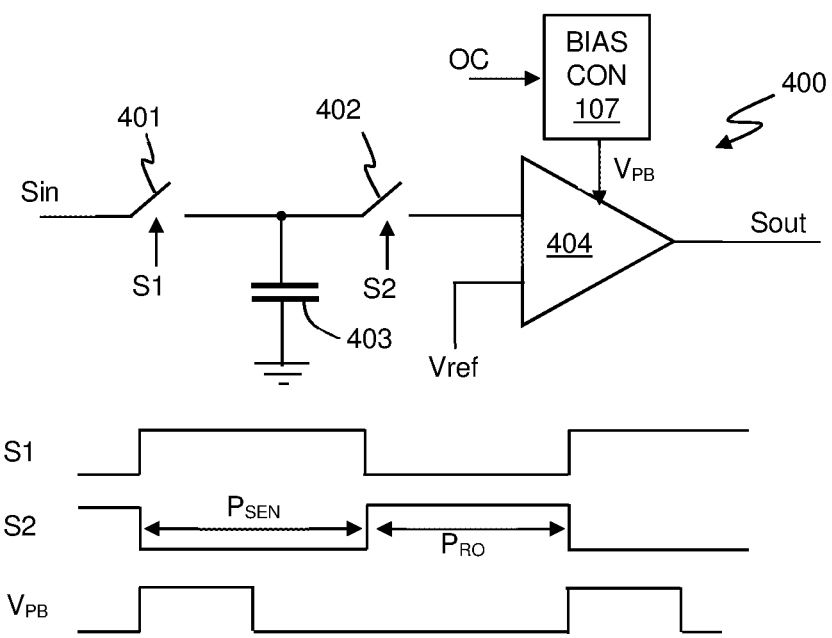
FIG. 4 illustrates an example of a sampling ADC with a bias controller.

FIG. 4 illustrates another example of circuit 400 that may include a bias controller 107 to dynamically control parameters of a pre-bias applied to one or more MOS devices of the circuit. The example of FIG. 4 is a sampling DAC (digital-to-analogue converter), having first and second switches 401 and 402. In a sensing phase $P_{SEN}$ the first switch is closed and the second switch 402 is open, so as to charge a sampling capacitor based on the input signal Sin. In a read-out phase $P_{RO}$ the first switch is opened and the second switch is closed to connect the sampling capacitor to an input of a comparator 404 that compares the voltage to one or more defined reference voltage $V_{REF}$.

As one skilled in the art will appreciate, the comparator 404 will typically include MOS transistors, and a pre-bias may be applied to at least some of these transistors, for instance the pair of input transistors of the comparator and one or more load devices. In embodiments of the present disclosure a pre-bias may be advantageously applied to the MOS devices of the current sources, where the pre-bias may be selectively controlled in use based on one or more operating conditions for the DAC circuit. FIG. 3 thus illustrates that DAC circuit 300 may thus comprise a bias controller 107, which receives an indication of one or more operating conditions OC and which dynamically varies one or more parameters of the pre-bias applied.

Figure 5:
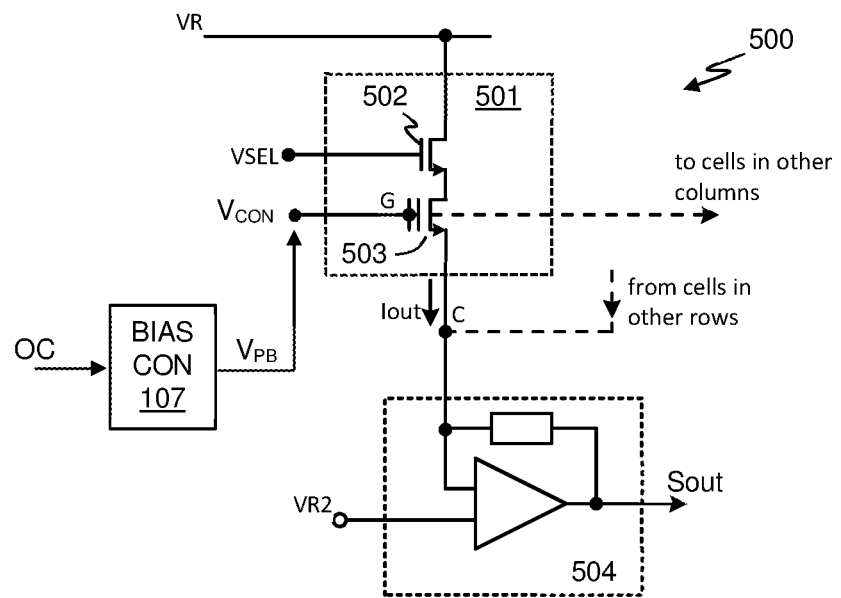
FIG. 5 illustrates an example of an analogue memory cell circuit with a bias controller.

FIG. 5 illustrates a further example of circuit 500 that may include a bias controller 107 to dynamically control parameters of a pre-bias applied to one or more MOS devices of the circuit. The circuit 500 is an analogue memory cell circuit. In some example the circuit may form part of an analogue computing system.

The circuit 500 includes a memory cell 501 which may be programmed to exhibit a desired current or conductance in operation, for example a transconductance. The memory cell may comprise a non-volatile MOS transistor, for example a flash or SONOS structure.

In this example, the memory cell 501 comprises a select transistor 502 in series with a floating gate transistor 503. The floating gate transistor 503 has a gate terminal G which is connected to a control gate. However, the channel of the transistor is covered by an intermediate floating gate structure. The state and the conductivity of the MOS channel is dependent on charge stored on the floating gate as well as on the voltage $V_{CON}$ applied on the control gate. The charge on the floating gate may be altered by applying positive or negative voltages on the control gate relative to the source of the transistor, where these voltages are large enough to cause significant tunnelling current through the gate dielectric to cause tunnelling currents. FIG. 5 shows an NMOS floating gate transistor and a single series NMOS select transistor, but variants comprising PMOS transistors or zero or multiple select transistors or other electrodes electrostatically coupled to the floating gate may be used.

In a memory write or programming phase the select transistor 502 may be turned off, to isolate the floating gate transistor, and suitably high magnitude voltages may be applied as the voltage $V_{CON}$ for the control gate so as to program the floating gate transistor. The effective threshold voltage of the device may be programmed, and a desired current, conductance, or transconductance may thus be obtained in a subsequent read phase when the control gate voltage $V_{CON}$ is set to a lower, nominal voltage.

Once programmed, in a read phase, the select transistor may be turned on to connect the drain of the floating gate transistor to a reference voltage VR and the gate control voltage $V_{CON}$ may be set to a lower magnitude.

In some instances the control gate voltage $V_{CON}$ may be set to a constant, predefined value, in which case the output current $I_{OUT}$ depends on the reference voltage and the programmed transconductance. In the read phase the memory cell thus provide an output current that depends on the programmed value. The output current $I_{OUT}$ may be buffered by a buffer 504 to provide an output signal.

In some implementations however the gate control $V_{CON}$ may be controllably varied according to some input data. For instance, during a read phase the control gate voltage may be modulated as a PWM waveform, to vary between two defined signal levels with a duty cycle that depends on the input data. The output current $I_{OUT}$ also varies with the control voltage and the total output current, over the course of the whole read phase, also depends on the duty cycle of the control voltage. The output current, integrated over the course of the read cycle thus has a value that depends on the product of the stored transconductance value and the input data value. The memory cell may therefore be used as part of an analogue computing system for performing a multiplication between some input data and a stored value, e.g. a weight value.

In some implementations a cross point array may be formed with multiple memory cells arranged in rows and columns. In some examples a group of memory cells, for instance column of memory cells, may be arranged to store a vector of weight values. Different input data values, collectively forming a data input vector, maybe applied to the respective memory cells in the different rows of the column during the same read phase. The output currents from all the memory cells during that read phase may be combined and integrated by the buffer 504 to provide an output which is effectively the dot product of the weight vector with the input data vector. The same data vector may be applied to other columns of memory cells to determine the dot product of the same date vector with different vectors of weight values.

The memory cell circuit may thus form part of a dot product engine as may be used in neuromorphic computing, for instance as part of a neural network.

During the read phase, RTS noise may affect the transconductance of the floating gate transistor and thus corrupt the weight value. In embodiments of the present disclosure a pre-bias may be advantageously applied to the floating gate MOS device of the current sources, where the pre-bias may be selectively controlled in use based on one or more operating conditions for the memory cell circuit. FIG. 5 thus illustrates that memory cell circuit 500 may thus comprise a bias controller 107, which receives an indication of one or more operating conditions OC and which dynamically varies one or more parameters of the pre-bias applied.

Thus the operation of the memory cell may also include a pre-biasing phase, in which appropriate pre-biasing is applied, prior to an instance of a read phase.

The bias controller 107 illustrated in any of the examples of FIG. 3, 4 or 5 may operate in generally the same manner as discussed with reference to FIG. 2 and may receive an indication of an operating condition that affects trap dynamics, such as temperature, an indication of noise from a feedback signal or test module, or some indication of an operating mode setting a desired accuracy/signal quality or noise performance, power consumption or sampling or processing rate. The bias controller 107 may control one or more parameters of the pre-bias applied such as the magnitude, duration, repeat frequency, ramp-rate or other waveform characteristics and/or whether any pre-bias at all is applied for some operating conditions.

The dynamic bias controller according to various embodiments can thus respond to the operating conditions to apply an appropriate pre-bias to MOS devices of the circuit so as to reduce RTS or flicker noise to the extent required, but without applying greater biasing than is required which may be detrimental to longevity of the circuitry and/or be wasteful or power add unnecessary latency.

A circuit according to an embodiment of the present invention may be implemented as an integrated circuit. The integrated circuit may be fabricated using a fabrication process with a relatively small process node geometry. Embodiments may be advantageously implemented as part of analogue or mixed signal circuitry.

Embodiments may be incorporated in a host electronic device, which may for example be a portable device and/or a device operable with battery power. The host device could be a communication device such as a mobile telephone or smartphone or similar, a computing device such as notebook, laptop or tablet computing device, a wearable device such as a smartwatch. The host device could alternatively be an accessory device for use with any such communication, computing or wearable device.

The skilled person will recognise that some aspects of the above-described apparatus and methods, may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A circuit comprising a first MOS transistor configured to be operable in an output phase to generate an analog output signal; and
a bias controller configured to control voltages at one or more terminals of the first MOS transistor to apply a pre-bias to the first MOS transistor in a pre-bias phase which precedes the output phase, wherein the pre-bias is applied to set an occupancy state of charge carriers traps within the first MOS transistor and wherein the bias controller is responsive to one or more operating conditions to dynamically adjust the pre-bias applied.

2. The circuit of claim 1 wherein the first MOS transistor is configured as part of an analog memory cell for storing a memory value, wherein in the output phase the analog output signal depends on the stored memory value.

3. The circuit of claim 1 wherein the memory cell is configured to store the memory value as a conductance or transconductance of the memory cell.

4. The circuit of claim 2 wherein the first MOS transistor comprises a control gate electrically connected to a gate terminal of the first MOS transistor and a floating gate disposed over a channel of the first MOS transistor such that a conductivity of the channel of the first MOS transistor depends on a charge stored on the floating gate.

5. The circuit of claim 4 comprising a memory controller configured to selectively control the memory cell in one of:
said output phase;
said pre-bias phase; or
a write phase in which the memory controller is configured to control the charge stored on the floating gate to store the memory value.

6. The circuit of claim 5 wherein the memory controller is configured, in a write phase, to control a gate voltage applied to the gate terminal of the first MOS transistor to cause tunnelling currents to control the charge stored on the floating gate.

7. The circuit of claim 5 wherein, in said output phase, one of a drain and source terminal of first MOS transistor is electrically connected to a reference voltage and the other of the drain and source terminal of first MOS transistor is electrically connected to an output of the memory cell for outputting the analog output signal and the gate terminal of the first MOS transistor is controlled to an output gate voltage.

8. The circuit of claim 7 wherein the memory controller is configured, when operating in the output phase, to control at least one of the reference voltage and the output gate voltage based on a data value such that the analog output signal depends on a product of the stored memory value and the input data value.

9. The circuit of claim 8 wherein the memory cell is configured as part of an analog computing system.

10. The circuit of claim 9 wherein the analog computing system comprises a cross point array of a plurality of memory cells.

11. The circuit of claim 1 wherein said one or more operating conditions comprise an operating condition that affects dynamics of charge carrier trapping by the charge carrier traps within the first MOS device.

12. The circuit of claim 1 wherein one of said one or more operating conditions comprises temperature and the bias controller is configured to receive an indication of temperature from a temperature sensor.

13. The circuit of claim 1 wherein one of said one or more operating conditions comprises an indication of monitored noise of the analog output signal.

14. The circuit of claim 1 wherein a system incorporating the circuit is operable in a plurality of different system modes and where the different system modes have different requirements for at least one of: noise performance or signal quality; power consumption; and operating rate, and said one or more operating conditions comprises an indication of the system mode.

15. The circuit of claim 1 wherein the bias controller is configured to dynamically adjust the pre-bias applied by controlling a magnitude of said voltages at one or more terminals of the first MOS transistor.

16. The circuit of claim 1 wherein the bias controller is configured to dynamically adjust the pre-bias applied by controlling a duration of application of said voltages at one or more terminals of the first MOS transistor.

17. The circuit of claim 1 wherein the bias controller is configured to dynamically adjust the pre-bias applied by controlling a duration between consecutive applications of said voltages at one or more terminals of the first MOS transistor.

18. The circuit of claim 1 wherein the bias controller is to dynamically adjust the pre-bias applied by controlling a waveform of said voltages at one or more terminals of the first MOS transistor.

19. An analog memory cell comprising:
a MOS memory element for storing a memory value; and
a memory controller configured to be operable in:
a write phase to write a memory value to the MOS memory element;
a pre-bias phase in which a bias controller applies a bias voltage to the MOS memory element to set an occupancy state of charge carriers traps within the MOS memory element; and a read phase to read the memory value from the MOS memory element;

wherein the bias controller is configured to dynamically adjust the bias voltage applied based on one or more operating conditions.

20. A signal processing circuit:

a MOS element for outputting an analog output signal in an output phase; and a bias controller configured to apply a bias voltage to the MOS element to set an occupancy state of charge carriers traps within the MOS element;

wherein the bias controller is configured to dynamically adjust the bias voltage applied based on one or more operating conditions of the signal processing circuit.

* * * * *